US006631847B1

United States Patent
Kasahara et al.

(12) United States Patent
(10) Patent No.: US 6,631,847 B1
(45) Date of Patent: Oct. 14, 2003

(54) IC CARD, ANTENNA FOR IC CARD, AND ANTENNA FRAME THEREFOR

(75) Inventors: Tetsuichiro Kasahara, Nagano (JP); Hirokazu Tsukioka, Nagano (JP); Hirofumi Haniuda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/573,503

(22) Filed: May 18, 2000

Related U.S. Application Data

(63) Continuation of application No. PCT/JP99/03559, filed on Jul. 1, 1999.

(30) Foreign Application Priority Data

Sep. 28, 1998 (JP) .......................................... 10-273475

(51) Int. Cl.⁷ .............................................. G06K 19/00
(52) U.S. Cl. ....................... 235/487; 235/488; 235/449; 235/492; 235/462.32
(58) Field of Search ................................. 235/487, 492, 235/486; 361/737; 257/679

(56) References Cited

U.S. PATENT DOCUMENTS

| | | | | |
|---|---|---|---|---|
| 5,705,852 A | * | 1/1998 | Orihara et al. .............. | 257/679 |
| 6,161,761 A | * | 12/2000 | Ghaem et al. ............... | 235/380 |
| 6,203,655 B1 | * | 3/2001 | Fujikawa et al. ........... | 156/272 |
| 6,252,777 B1 | * | 6/2001 | Ikeda et al. ................. | 361/737 |
| 6,255,725 B1 | * | 7/2001 | Akagawa et al. ........... | 257/679 |
| 6,330,162 B2 | * | 12/2001 | Sakamoto et al. ......... | 174/52.3 |

FOREIGN PATENT DOCUMENTS

| | | |
|---|---|---|
| EP | 710 919 A2 | 5/1996 |
| JP | 64-2191 | 11/1989 |
| JP | 10-193850 | 7/1998 |
| JP | 287073 | * 10/1998 |

* cited by examiner

*Primary Examiner*—Thien M. Le
*Assistant Examiner*—Allyson Sanders
(74) *Attorney, Agent, or Firm*—Pennie & Edmonds LLP

(57) ABSTRACT

There is provided an IC card having a plane coil in which a short circuit is seldom caused by the deformation generated by an external force given to the plane coil in the traverse direction. An IC card 10 comprises a rectangular plane coil 14 formed by punching or etching a thin metallic sheet in which a conductor line 12 is wound a plurality of times on substantially the same plane, wherein terminals at both ends of the plane coil 14 and electrode terminals of a semiconductor element 16 are electrically connected with each other, and a bent portion 20 composed of a curved portion in which the conductor 12 on each winding composing a linear portion of the plane coil 14 is curved at the substantially same position in the same direction is formed in the conductor on each winding of the plane coil 14.

25 Claims, 7 Drawing Sheets

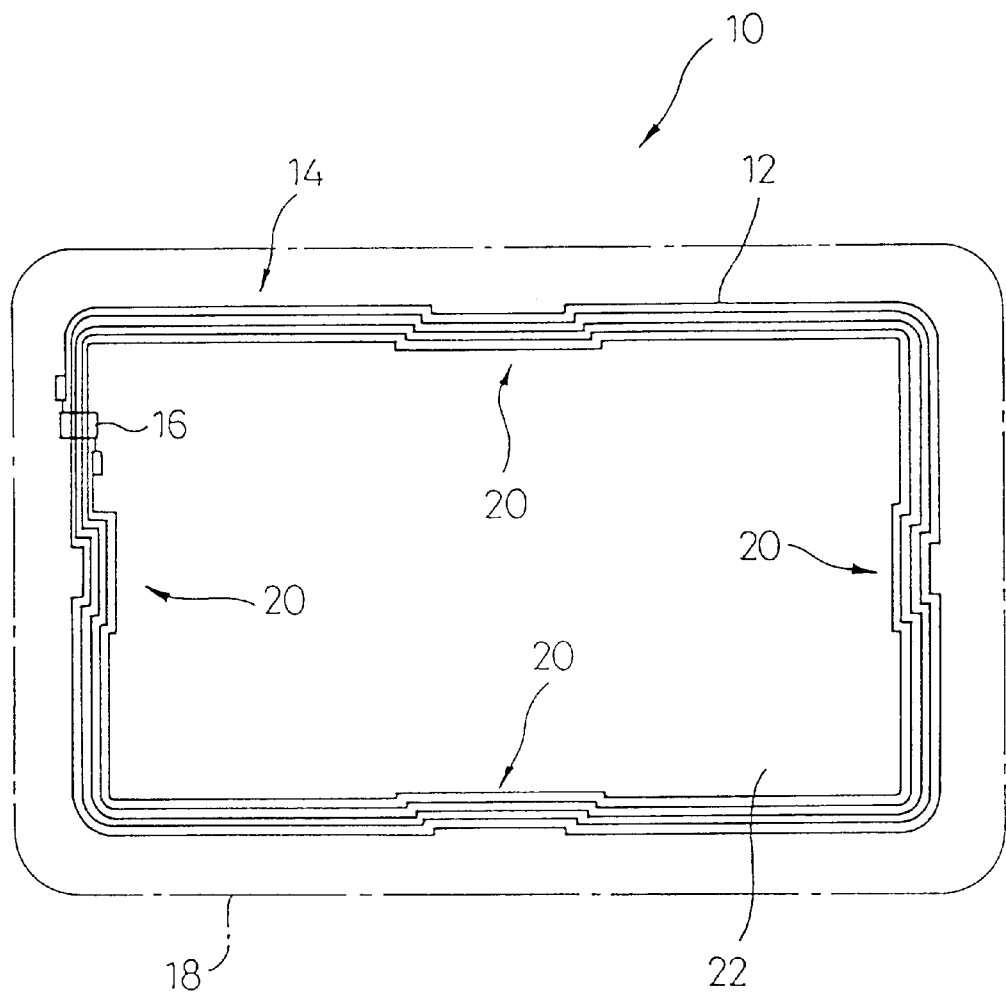

IC CARD, ANTENNA FOR IC CARD, AND ANTENNA FRAME THEREFOR

This is a continuation of the U.S. national phase of PCT application PCT/JP99/03559 filed Jul. 1, 1999.

FIELD OF THE INVENTION

The present invention relates to an IC card, an antenna for the IC card, and an antenna frame for the IC card. More particularly, the present invention relates to an IC card having a plane coil formed by punching or etching a thin metallic sheet in which a conductor is wound a plurality of times on the same plane, wherein terminals of the plane coil and electrode terminals of a semiconductor element are electrically connected to each other, and also the present invention relates to an antenna for the IC card composed of the plane coil, and an antenna frame for the IC card.

DESCRIPTION OF THE BACKGROUND ART

As shown in FIG. 9, the IC card includes: a rectangular plane coil 100 in which a conductor 102 is wound a plurality of times; and a semiconductor element 104. The above plane coil 100 and the semiconductor element 104 are interposed between two sheets of resin films 106 made of polyvinyl chloride (PVC) on which characters etc. are printed. The two sheets of resin films 106 are made to adhere to, each other by an adhesive layer made of polyurethane resin. This adhesive layer seals the plane coil 100 and the semiconductor element 104.

When the thus formed IC card passes through a magnetic field formed by a card processor, electric power is generated by electromagnetic induction caused in the plane coil 100 of the IC card. Therefore, the semiconductor element 104 is started by the generated electric power, so that communication can be held between the semiconductor element 104 of the IC card and the card processor via the plane coil 100 which functions as an antenna.

The plane coil 100 used for the above IC card is conventionally formed in such a manner that a covered electric wire is wound a plurality of times.

However, when the covered electric wire is wound so as to form the plane coil 100, it is difficult to reduce the cost of the plane coil 100 and also it is difficult to mass-produce the plane coil 100. For the above reasons, it is difficult to spread the use of the IC card widely.

In order to solve the above problems, Japanese Unexamined Patent Publication No. 6-310324 discloses an IC card into which a plane coil, which is formed by punching a thin metallic sheet, is incorporated.

As proposed by the above patent publication, when the plane coil is formed by punching a thin metallic sheet, the manufacturing cost of the IC card can be reduced and the IC card can be mass-produced as compared with the IC card into which the conventional plane coil, which is formed by winding a covered electric wire a plurality of times, is incorporated.

However, it has been found that the handling property of the plane coil formed by punching a thin metallic sheet is very inferior. This is described as follows. When no external forces are given to the rectangular plane coil 100 formed by punching a thin metallic sheet, predetermined intervals are kept between the conductor which is arranged as shown in FIG. 10(a). However, when an external force F acts on the plane coil 100 in the traverse direction as shown in FIG. 10(b), the conductor is deformed, so that the conductor windings, which are adjacent to each other, come into contact with each other, and a short-circuit occurs.

The conductor windings tend to come into contact with each other due to deformation caused by external forces acting on the conductor windings when the plane coil 100 is conveyed and assembled. Also, the conductor windings tend to come into contact with each other by due to deformation caused by the flow of adhesive when the plane coil 100 is interposed between two sheets of resin films 106, on one side of which an adhesive layer is provided.

DISCLOSURE OF THE INVENTION

An object of the present invention is to provide an IC card having a plane coil, the deformation of which is seldom caused by an external force given to the plane coil in the traverse direction when the IC card is conveyed and assembled.

In order to solve the above problems, the present inventors made experiments and found the following knowledge. When a bent portion, which protrudes inward or outward with respect to the plane coil 100, is formed in the conductor 102 on each winding composing a linear portion of the rectangular plane coil 100, it becomes possible to enhance the rigidity of the conductor line 102. Therefore, even if an external force is given to the conductor 102 in the traverse direction, the conductor 102 can sufficiently resist it. According to the above knowledge, the present inventors accomplished the present invention.

The present invention provides an IC card comprising a plane coil formed by punching or etching a thin metallic sheet in which a conductor line is wound a plurality of times on substantially the same plane, wherein terminals at both ends of the plane coil and electrode terminals of a semiconductor element are electrically connected to each other, and a curved portion protruding inward and/or outward with respect to the plane coil is formed in the conductor on each winding composing the plane coil.

Also, the present invention provides an antenna for an IC card having a plane coil formed by punching or etching a thin metallic sheet in which a conductor line is substantially wound a plurality of times on the same plane, wherein a bent portion protruding inward and/or outward with respect to the plane coil is formed in the conductor on each winding composing the plane coil.

Also, the present invention provides an antenna frame for an IC card characterized in that: a plane coil formed by punching or etching a thin metallic sheet in which a conductor line is substantially wound by a plurality of times on the same plane is supported by an outside frame formed in such a manner that a predetermined interval is left between the outermost conductor of the plane coil and the outside frame, and the outermost conductor of the plane coil is connected with a support portion extending from an inside edge of the outside frame.

In the present invention described above, the plane coil is formed into a rectangle, and the curved portion protruding inward and/or outward with respect to the plane coil is formed in the conductor on each winding composing the linear portion of the plane coil. Due to the above structure, rigidity of the conductor can be enhanced. Therefore, it is possible to sufficiently resist an external force given to the plane coil in the transverse direction.

Concerning the curved portion of the conductor on each winding, when the conductor on each winding is curved at the substantially same position in the same direction, it is possible to form a plane coil having the bent portion in which the conductor on each winding is curved.

When an inside frame is formed in a space inside the plane coil in such a manner that a predetermined interval is left between the innermost conductor of the plane coil and the inside frame and also when the innermost conductor is connected with a support portion extending from the outside edge of the inside frame, the space inside the plane coil can be substantially closed by the inside frame. Due to the above structure, when the antenna frame for the IC card is conveyed, it is possible to prevent another antenna frame of the IC card from entering the space inside the plane coil. Therefore, the handling property of the antenna frame of the IC card can be further enhanced.

Further, when the conductors adjacent to each other in the inward and outward direction of the plane coil are connected with each other by connecting pieces, the conductors can be integrated into one body and prevented from collapsing when the antenna frame 40 for the IC card is conveyed. Therefore, the handling property of the antenna frame of the IC card can be further enhanced.

In the plane coil used for the antenna for the IC card of the present invention, the curved portion protruding in the inward and/or outward direction of the plane coil is formed in the conductor on each winding. Therefore, the rigidity of the conductor of the plane coil of the present invention is higher than that of the conductor in which the curved portion is not formed. Further, the rigidity of the plane coil composed of the conductors can be enhanced, since the rigidity of conductor's is enhanced.

As a result, even if the conductor of the plane coil is given an external force in the traverse direction when the plane coil is conveyed and accommodated in the manufacturing process of the IC card, the plane coil is seldom deformed. Therefore, it is possible to effectively prevent the occurrence of short circuit of the conductor on each winding composing the plane coil used for the antenna. Accordingly, reliability can be enhanced.

BRIEF DESCRIPTION OF THE DRAWINGS

FIG. 1 is a plan view showing an example of the plane coil composing the IC card of the present invention.

BEST MODE FOR CARRYING THE INVENTION

Figure 2A:
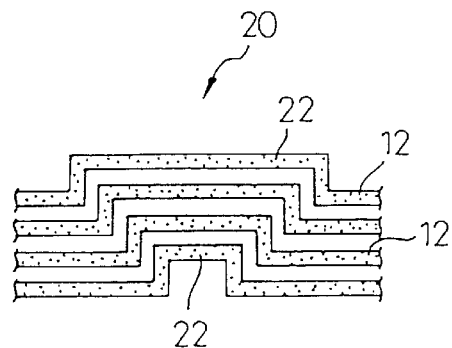
FIGS. 2(a) to 2(c) are partially enlarged views for explaining a configuration of the curved portion formed in the conductor composing the plane coil.

An example of the IC card of the present invention is shown in FIG. 1. The IC card 10 shown in FIG. 1 includes: a rectangular plane coil 14 in which a conductor 12 is wound a plurality of times; and a semiconductor element 16. The above plane coil 14 and the semiconductor element 16 are interposed between two sheets of resin films 18 made of polyvinyl chloride (PVC) on which characters and others are printed. The two sheets of resin films 18 are made to adhere to each other by an adhesive layer made of polyurethane resin. This adhesive layer seals the plane coil 14 and the semiconductor element 16.

This plane coil 14 functions as an antenna of the IC card by which information is transmitted between the semiconductor element 16 and a card processor as follows. When the IC card 10 is made to pass in a magnetic field formed by the card processor, electric power is generated by electromagnetic induction caused in the plane coil 14 of the IC card. Therefore, the semiconductor element 16 is started by the generated electric power, so that communication can be held between the semiconductor element 16 of the IC card and the card processor via the plane coil 14 which functions as an antenna.

The plane coil 14 shown in FIG. 1 is rectangular, and the bent portion 20 is formed in a linear portion on each side. AS shown in FIG. 2(a), this bent portion 20 is composed of a curved portion 22 which is curved at the substantially same position in the same direction, that is, in the inward direction with respect to the plane coil 14. Rigidity of the conductor 12 on each winding in which the above curved portion 22 is formed is higher than the conductor in which the above curved portion 22 is not formed.

In this curved portion 22, the conductor 12 on each winding is curved inward with respect to the plane coil 14 at the same position. Therefore, it can be assumed that the bent portion 20 is formed in the linear portion of the plane coil 14.

Figure 2B:
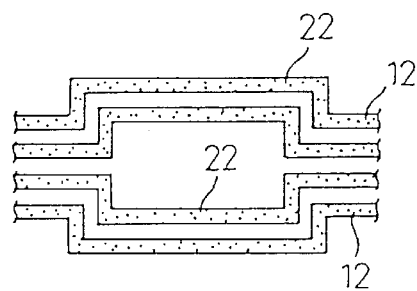
Figure 2C:
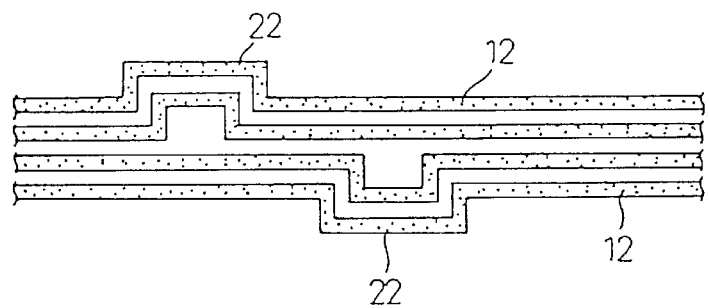

In the bent portion 20 of the plane coil 14 shown in FIG. 1, as shown in FIG. 2(a), the conductor 12 on each winding is curved in the inward direction with respect to the plane coil 14 at substantially the same position so that the curved portion 22 is formed. However, as shown in FIG. 2(b), the conductors 12 on the circumferences may be curved so that the curved directions of the curved portions 22, 22 . . . can be opposite to each other. Further, as shown in FIG. 2(c), the positions of the curved portions 22, 22 . . . may be different from each other.

In the plane coil 14 shown in FIG. 1, one bent portion 20 is formed in one linear portion. However, it is possible to form a plurality of bent portions 20 in one linear portion, that is, it is possible to form a plurality of curved portions 22 on the conductor 12 on each winding composing one linear portion.

Figure 3:
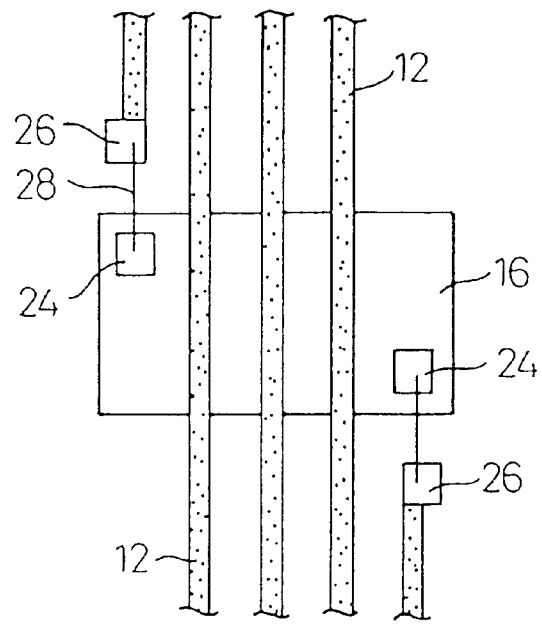
FIG. 3 is a partially enlarged plan view for explaining a state of a portion of the plane coil on which a semiconductor is mounted.

In the plane coil 14 shown in FIG. 1, the width of a portion on which the semiconductor element 16 is mounted is narrower than the widths of other portions, that is, the conductors 12 on the circumferences are arranged at intervals smaller than the intervals of the conductors 12 arranged in other portions. The reason is described as follows. As shown in FIG. 3, the conductor 12 on each winding, which is arranged between the plane coil terminals 26, 26, passes between the electrode terminals 24, 24 on both sides of the electrode terminals 24, 24 of the semiconductor element 16. When the semiconductor element 16 is mounted on the mount portion of the plane coil 14, the electrode terminals 24, 24 of the semiconductor element 16 are opposed to the terminals 26, 26 of the plane coil 14. Therefore, the terminals can be easily connected with each other by the wires 28, 28.

Figure 4:
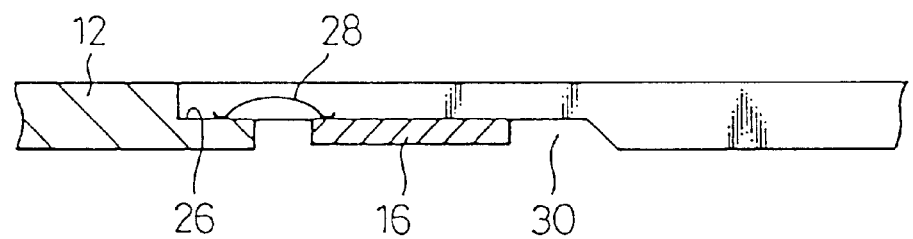
FIG. 4 is a partially enlarged cross-sectional view for explaining a state of a portion of the plane coil on which a semiconductor is mounted.

The mount portion of the plane coil 14 on which the semiconductor element 16 is mounted is a recess 30 which is formed downward in the conductor 12 on each winding as shown in FIG. 4. Further, the terminals 26, 26 of the plane coil 14 are subjected to squeezing, so that the terminal area is extended, and at the same time, an end face of the terminal 26 is formed to be lower than an upper face of the conductor 12. Due to the above arrangement, of course, the semiconductor element 16, the formation faces of the electrode terminals 24, 24 of which are arranged downward, does not protrude from the face of the plane coil 14, and further the wires 28, 28, which connect the electrode terminals 24, 24 of the semiconductor element 16 with the terminals 26, 26 of the plane coil 14, do not protrude from the face of the plane coil 14.

The IC card 10 shown in FIG. 1 is manufactured as follows. First, the plane coil 14 is formed by etching or punching a metal sheet. Then, the semiconductor element 16 is mounted in a portion close to the terminals 26, 26 of the plane coil 14. In this portion around the terminals 26, 26 of the plane coil 14, the conductors 12 are arranged at intervals smaller than the intervals of the conductors of other portions. In the conductors 12 arranged on the circumferences, the intervals of which are small, there are formed recesses 30 which are directed downward. In the arrangement shown in FIG. 1, the semiconductor element 16 is mounted so that the formation faces of the electrode terminals 24, 24 can be directed onto the bottom face side of the recess 30.

In this case, the metallic sheet can be made of copper, iron or aluminum. Also, the metallic sheet can be made of one of the alloys of the above metals. When the metallic sheet is made of iron or aluminum, the cost of the final product can be reduced.

Next, the electrode terminals 24, 24 of the semiconductor element 16 are connected with the terminals 26, 26 of the plane coil 14 by wires 28, 28 made of gold, platinum or aluminum. When the above wire 28, 28 are used for connection, it is preferable to adopt the wedge bonding method, because the sizes of the loops of the wires 28, 28 can be decreased as much as possible.

After that, the plane coil 14 on which the semiconductor element 16 is mounted is interposed between two sheets of resin films made of PVC, on the front faces of which characters are printed, by which the front and the reverse face of the IC card are formed. At this time, the plane coil 14, semiconductor element 16 and wires 28, 28 are sealed by the adhesive layer made of polyurethane resin or polyolefin resin which is formed on one side of the resin film 18.

In the manufacturing process of the IC card, the plane coil 14 includes a curved portion 22 which is formed in the conductor 12 arranged on each winding composing the linear portion. Therefore, it is possible to enhance the rigidity of the conductor 12, and the conductor 12 is not deformed even if an external force is given to the conductor 102 shown in FIG. 9 in the traverse direction.

Accordingly, even if an external force is given to the plane coil 14 when it is conveyed and assembled in the manufacturing process, it is possible to prevent the deformation of the conductor 12. Also even if an external force is given to the plane coil 14 by the flow of adhesive when the plane coil 14 is interposed between the two sheets of resin films 18, it is possible to prevent the deformation of the conductor 12. Therefore, it is possible to prevent the occurrence of a short circuit caused when the conductors composing the plane coil 14 come into contact with each other. As a result, the reliability of the finally obtained IC card 10 can be enhanced.

Figure 9:
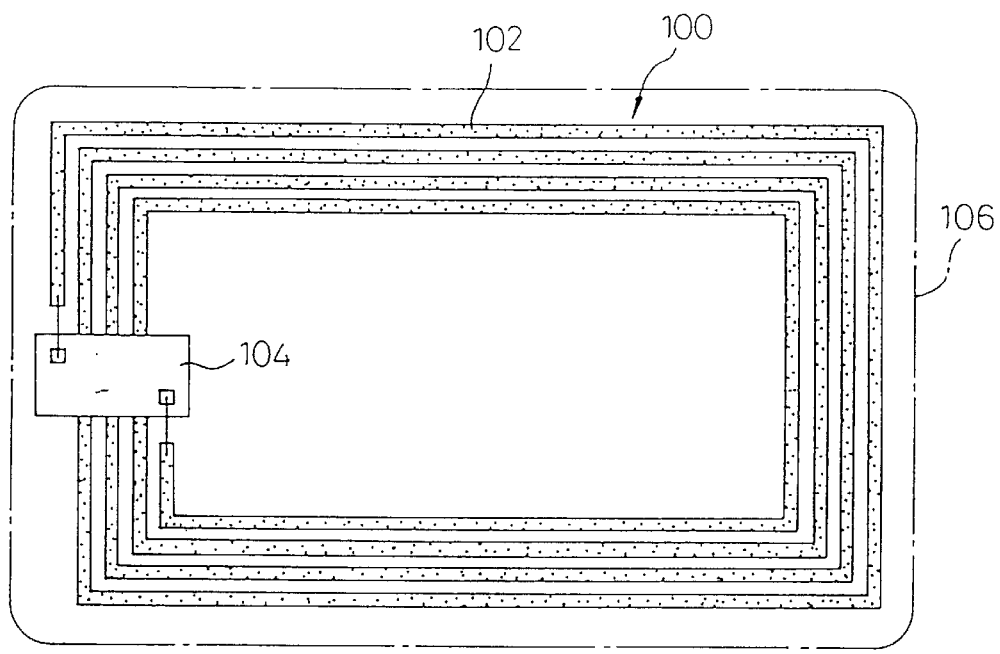
FIG. 9 is a plan view showing an example of the plane coil composing the conventional IC card.
Figure 10A:
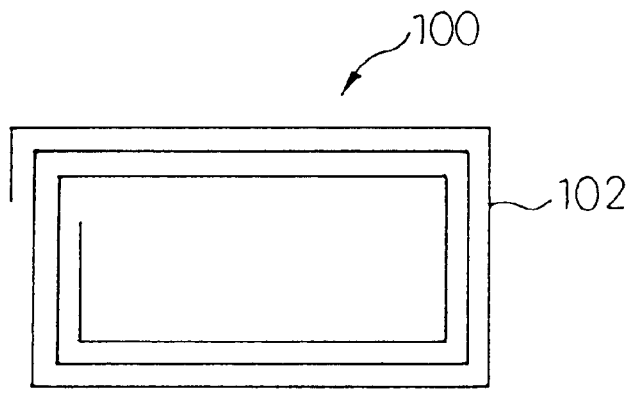
FIGS. 10(a) and 10(b) are schematic illustrations for explaining a state in which an external force is given to the conductor composing the conventional plane coil in the traverse direction.
Figure 10B:
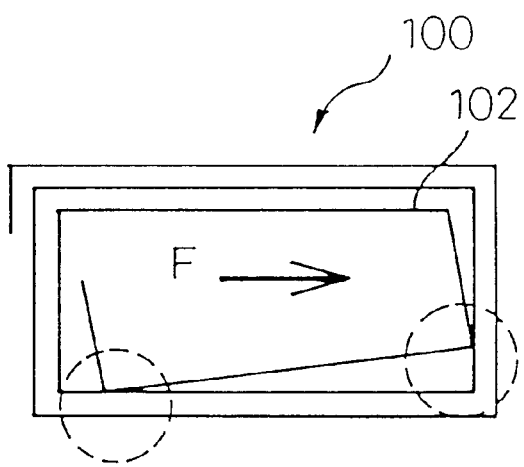

In this connection, when the conventional plane coil 100 shown in FIG. 9 is formed by punching a metallic sheet, in order to form the linear portion of the conductor 102 on each winding, it is necessary to use a long and slender punch. However, the rigidity of the long and slender punch is low. Therefore, the punch tends to be damaged in the process of punching. Further, since the punch is deformed in the process of punching, the conductors of the plane coil tend to be twisted.

When the plane coil 14 shown in FIG. 1 is made by punching, the curved portion, the configuration of which is the same as that of the conductor 12 to be formed, is formed in the middle of the long and slender punch used for forming the conductor 12 which composes the linear portion of the plane coil 14. When the above curved portion is formed in the long and slender punch, the rigidity can be enhanced as compared with the long and slender punch in which the curved portion is not formed. For the above reasons, it is possible to prevent the punch from being damaged or deformed in the process of punching. Accordingly, the plane coil 14 can be easily formed by punching.

Figure 5:
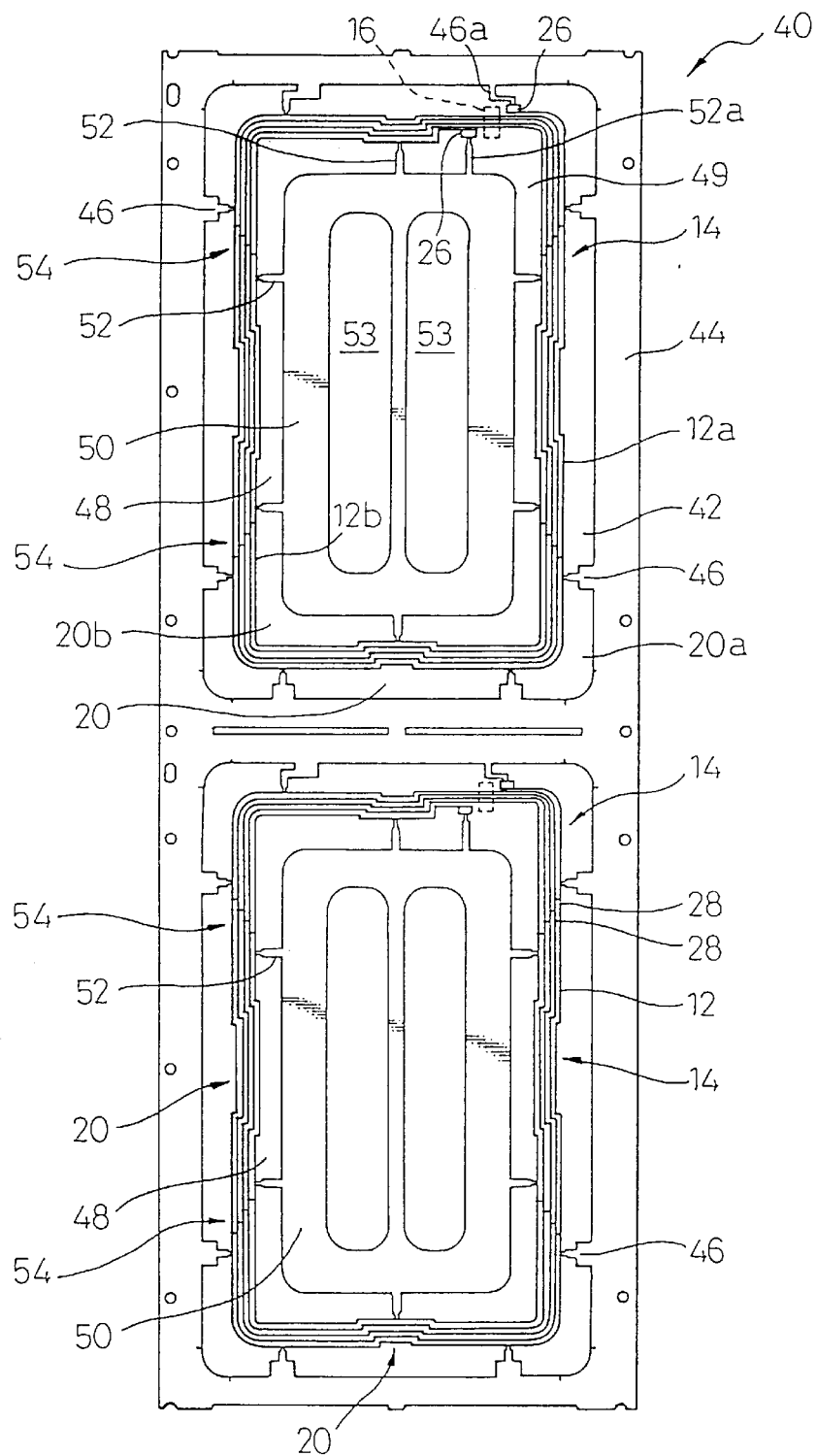
FIG. 5 is a plan view showing an example of the antenna frame for the IC card of the present invention.

The plane coil 14 shown in FIG. 1 may be individually formed by etching or punching a metallic sheet. However, it is preferable that an antenna frame 40 of the IC card is formed as shown in FIG. 5, because the plane coil 14 having the antenna frame 40 can be easily conveyed and accommodated as compared with a case in which the plane coil 14 is singly conveyed and accommodated. Concerning the metallic sheet, it is preferable to use a strip-shaped metallic sheet. In this case, a rolled strip-shaped metallic sheet may be used in such a manner that the metallic sheet is drawn out from the rolled strip-shaped metallic sheet.

The antenna frame 40 for the IC card shown in FIG. 5 is composed in such a manner that the rectangular plane coil 14 is supported by the outside frame 44 while a predetermined interval 42 is left between the outermost conductor 12a of the plane coil 14 and the outside frame 44. The plane coil 14 is supported in such a manner that end portions of the support portions 46, 46 . . . extending from the different positions of the inside edge of the outside frame 44 are connected with the outermost conductor 12a of the plane coil 14. In the frame 40 shown in FIG. 5, each side of the rectangular plane coil 14 is respectively supported by two support portions 46. In this connection, in a region in which the semiconductor element 16 is mounted, the support portion 46a extending inward from the outside frame 44 is connected with a portion of the outside terminal 26 of the plane coil 14.

In the inside space of the plane coil 14, there is provided an inside frame 50 which is arranged inside the plane coil 14 while a predetermined interval 48 is left between the innermost conductor 12b of the plane coil 14 and the inside frame 50. The support portions 52, 52 . . . , which extend from a plurality of portions of the outside edge of the inside frame 50 to the plane coil 14, and the innermost conductor 12b of the plane coil 14 are connected with each other. When the inside frame 50 is provided in this way, the inside space 49 of the plane coil 14 can be substantially closed. Due to the above arrangement, it is possible to prevent another IC card from entering the inside space of the plane coil 14 when the antenna frame 40 for the IC card is conveyed. Therefore, the handling property of the antenna frame 40 for the IC card can be further enhanced. In this inside frame 50, there are provided spaces 53, 53 for reducing the weight of the inside frame 50. In the region in which the semiconductor element 16 is mounted, the support portion 52a extending outward from the inside frame 50 is connected with a portion of the inside terminal 26 of the plane coil 14.

Figure 6:
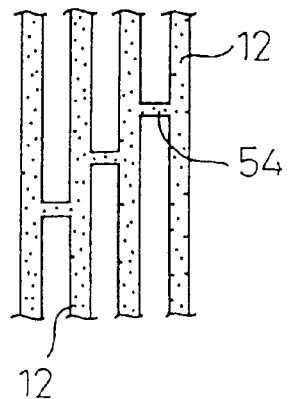
FIG. 6 is a partially enlarged plan view for explaining a state in which the conductors composing the plane coil formed in the antenna frame for the IC card shown in FIG. 5 are connected with each other by connecting pieces.

Further, when the conductors 12 adjacent to each other in the inward and outward direction of the plane coil 14 are connected with each other by connecting pieces 54 as shown in FIG. 6, the conductors 12, 12 . . . composing the plane coil 14 can be integrated into one body and prevented from collapsing when the antenna frame 40 for the IC card is conveyed. Therefore, the handling property of the antenna frame of the IC card can be further enhanced.

When the connecting pieces 54 are formed stepwise between the conductors 12 arranged on the circumferences as illustrated in FIG. 6, they can be easily cut off by a punch for cutting, and further the mechanical strength of the punch for cutting can be enhanced. These circumstances are described as follows. Usually, the connecting pieces 54, 54 . . . are simultaneously cut off. Therefore, in the case where the connecting pieces 54, 54 . . . are arranged in a straight line, the configuration of the punch for cutting must be formed into a comb-shape, and it is difficult to machine the punch for cutting, and further the mechanical strength of the punch for cutting is decreased. When the connecting pieces 54, 54 . . . are formed stepwise as shown in FIG. 6, it becomes possible to shift the position of the punch for cutting according to the forming position of the connecting pieces 54, 54 . . . Therefore, the punch for cutting can be easily machined, and the mechanical strength of the punch for cutting can be enhanced.

The rectangular plane coil 14 shown in FIG. 5 includes a bent portion 20 which is formed in each linear portion of the plane coil 14 in the same manner as that of the plane coil 14 shown in FIG. 1. This bent portion 20 is composed of a curved portion 22 in which the conductors 12 on the circumferences are curved and protruded at the substantially same position in the same direction (in the inward direction of the plane coil 14).

The IC card 10 is manufactured by using the antenna frame 40 for the IC card shown in FIG. 5 as follows. First, the semiconductor element 16 is mounted on the plane coil 14 which is connected with the support portion 46 of the outside frame 44 and the support portion 52 of the inside frame 50. This portion of the plane coil 14 on which the semiconductor element 16 is mounted is located close to the terminal 26 of the plane coil 14. In this portion, the intervals of the conductors on the circumferences are smaller than those of the other portions, and the recesses 30 are formed downward in the conductors 12 on the circumferences, the intervals of which are small. In the arrangement shown in FIG. 5, the semiconductor element 16 is mounted so that the formation face of the electrode terminals 24, 24 of the semiconductor element 16 can be directed onto the bottom face side of the recess 30.

The electrode terminals 24 of the semiconductor element 16 mounted on the plane coil 14 are connected with the terminals 26, 26 of the plane coil 14 by wires 28, 28. It is preferable that the connection of the terminals, in which the wires 28, 28 are used, is made by the wedge-bonding method.

Next, the plane coil 14 on which the semiconductor element 16 is mounted is cut off from the support portion 46 of the outside frame 44 and the support portion 52 of the inside frame 50, and at the same time, the connecting pieces 54, 54 . . . for connecting the conductors 12 on the circumferences are cut off. The connecting pieces 54, 54 . . . are simultaneously cut off with a punch for cutting which is formed according to the configuration of the connecting pieces 54, 54 . . . which are arranged stepwise.

After that, the plane coil 14 on which the semiconductor element 16 is mounted, which has been cut off from the antenna frame 40 for the IC card, is sealed. This sealing is made as follows. The plane coil 14 is interposed between two sheets of resin films 18 made of PVC, on the front side of which characters are printed, on the reverse side of which an adhesive layer made of polyurethane resin or polyolefin resin is provided.

In FIGS. 1 to 6 explained above, the bent portion 20 is formed in each linear portion of the rectangular plane coil 14. However, even when the bent portion 20 is formed in one of the linear portions composing the rectangular plane coil, the rigidity of the plane coil can be enhanced as compared with the plane coil 100 shown in FIG. 9 in which no bent portions 20 are formed.

Even if the plane coil is circular or elliptical, when the curved portion protruding inward and/or outward with respect to the plane coil is formed in the conductor on each winding composing the plane coil, it is possible to enhance the rigidity of the conductor, so that the plane coil is not deformed even if an external force is given to the plane coil in the traverse direction.

Figure 7:
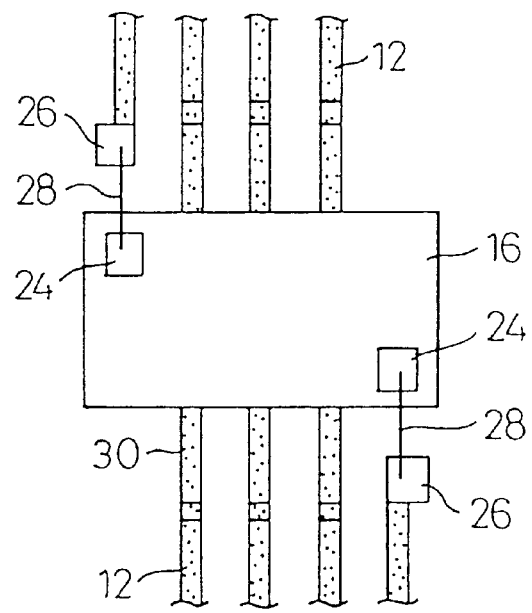
FIG. 7 is a partially enlarged plan view for explaining another state of a portion of the plane coil on which a semiconductor element is mounted.

Further, as shown in FIG. 7, the conductors 12 on the circumferences, which are arranged between the terminals 26, 26 of the plane coil, may be made to pass through on one face of the semiconductor element 16 which is opposite to the other face on which the electrode terminals 24, 24 of the semiconductor element 16 are formed. In this case, as shown in FIG. 8(a), the recess 30, which is directed upward, is formed in a portion of the conductor 12 on each winding in which the semiconductor element 16 is mounted, and the semiconductor element 16 is mounted on the bottom face side of the recess 30.

Figure 8A:
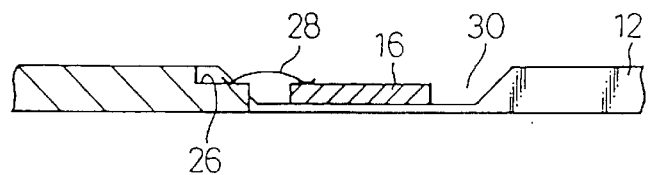
FIGS. 8(a) and 8(b) are partially enlarged cross-sectional views for explaining another state of a portion of the plane coil on which a semiconductor element is mounted.
Figure 8B:
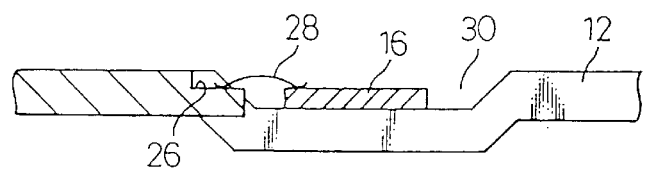

In this connection, when the recess 30 is formed in the conductor 12 on each winding as shown in FIG. 8(a), there is a possibility that a portion of the conductor 12 which forms the bottom face of the recess 30 becomes too thin. In this case, a portion of the conductor 12 may be bent as shown in FIG. 8(b) so as to form the recess 30.

According to the present invention, it is possible to enhance the rigidity of the conductor composing the plane coil used as an antenna of the IC card. Therefore, the plane coil can sufficiently resist an external force given to it in the traverse direction. Consequently, in the final product of the IC card, it is possible to prevent the occurrence of a short circuit between the conductors composing the plane coil. As a result, the reliability of the IC card can be enhanced.

What is claimed is:

1. An IC card comprising a plane coil formed by punching or etching a thin metallic sheet in which a conductor line is wound a plurality of times on substantially a same plane, wherein terminals at both ends of the plane coil and electrode terminals of a semiconductor element are electrically connected with each other, and a curved portion protruding inward and/or outward with respect to the plane coil is formed in the conductor line on each winding composing the plane coil in a position such that the curved portion does not overlay or surround the semiconductor element.

2. An IC card according to claim 1, wherein the plane coil is rectangular, and a curved portion protruding inward and/or outward with respect to the plane coil is formed in the conductor on each winding composing a linear portion of the plane coil.

3. An IC card according to claim 2, wherein the curved portion formed in the conductor on each winding is curved at a substantially same position in the same direction.

4. An IC card according to claim 2, wherein the conductor on each winding composing the linear portion of the plane coil is arranged substantially in parallel to an adjacent conductor, and a curved portion protruding inward and/or outward with respect to the plane coil is formed on the conductor on each winding in the linear portion.

5. An antenna for an IC card having a plane coil, formed by punching or etching a thin metallic sheet, in which a conductor line is substantially wound by a plurality of times on a same plane, wherein a curved portion protruding inward and/or outward with respect to the plane coil is formed in the conductor line on each winding composing the plane coil in a position such that the curved portion does not overlay or surround the semiconductor element.

6. An antenna for an IC card according to claim 5, wherein the plane coil is rectangular, and a curved portion protruding inward and/or outward with respect to the plan coil is formed in the conductor on each winding composing a linear portion of the plane coil.

7. An antenna for an IC card according to claim 6, wherein the curved portion formed in the conductor on each winding is curved at a substantially same position in the same direction.

8. An antenna for an IC card according to claim 6, wherein the conductor on each winding composing the linear portion of the plane coil is arranged substantially in parallel to the adjacent conductor, and a curved portion protruding inward and/or outward with respect to the plane coil is formed in the conductor on each winding in the linear portion.

9. An antenna frame for an IC card characterized in that: a plane coil formed by punching or etching a thin metallic sheet in which a conductor line is substantially wound a plurality of times on a same plane is supported by an outside frame formed in such a manner that a predetermined interval is left between an outermost conductor of the plane coil and the outside frame, and the outermost conductor of the plane coil is connected with a support portion extending from an inside edge of the outside frame.

10. An antenna frame for an IC card according to claim 9, wherein an inside frame is formed in the inside space of the plane coil while a predetermined interval is formed between an innermost conductor of the plane coil and the inside frame, and a support portion extending from an outside edge of the inside frame and the innermost conductor of the plane coil are connected with each other.

11. An antenna frame for an IC card according to claim 9, wherein the conductors on circumferences adjacent to each other in an inward and outward direction of the plane coil are connected with each other by connecting pieces.

12. An antenna frame for an IC card according to claim 9, wherein a curved portion protruding inward and/or outward with respect to the plane coil is formed in the conductor on each winding composing the plane coil.

13. An antenna frame for an IC card according to claim 9, wherein the plane coil is rectangular, and a curved portion protruding inward and/or outward with respect to the plane coil is formed in the conductor on each winding composing the linear portion of the plane coil.

14. An antenna frame for an IC card according to claim 12, wherein the curved portion formed in the conductor on each winding is curved a the substantially same position in a same direction.

15. An antenna frame for an IC card according to claim 9, wherein the outside frame is composed of two rails extending in the longitudinal direction substantially in parallel to each other and bars extending in a traverse direction leaving a regular internal in the longitudinal direction, and the plane coil is formed in a space specified by the two rails and bars leaving a predetermined interval between the plane coil and the two rails and bars.

16. An IC card comprising:

a semiconductor element having electrode terminals;

a plane coil including a conductor line wound in a geometric pattern around a portion of the IC card at least three times to form at least three windings on a same plane, the plane coil also including terminals substantially located at each end of the conductor line, wherein the plane coil terminals and the semiconductor electrode terminals are electrically connected with each other; and a displaced portion of the plane coil, wherein a plurality of the windings of the plane coil include, in a location not overlaying or surrounding the semiconductor element, a length which extends a small fraction of the way around a winding that is displaced from the geometric pattern in either an inward or an outward direction but is not displaced from the plane.

17. The IC card of claim 16 wherein the geometric pattern comprises a plurality of substantially straight sides, wherein a first displaced portion of the plane coil extends a fraction of the length of the first associated straight side, and wherein a second displaced portion of the plane coil extends a fraction of the length of the second associated straight side.

18. The IC card of claim 16 comprising a plurality of displaced portions of the plane coil, wherein at least one of the displaced portions is in a location not overlaying or surrounding the semiconductor element, and wherein one of the displaced portions may lie in a location overlaying or surrounding the semiconductor element.

19. The IC card of claim 16 wherein the geometric pattern is substantially rectangular, and a displaced portion of the plane coil protruding inward and/or outward with respect to the rectangle is formed on each winding in a plurality of linear portions of the rectangle.

20. The IC card of claim 16 wherein the displaced portion comprises at least three windings that are displaced from the geometric pattern, and wherein the centers of length of each of the at least three windings displaced from the geometric pattern form a substantially straight line.

21. The IC card of claim 16 wherein the geometric pattern is substantially rectangular comprising four substantially straight sides, and wherein at least two windings each comprises a portion that is displaced from a first side such that the ends of the displaced portions are each on the first side.

22. The IC card of claim 16 wherein the plane coil is supported by an outside frame formed in such a manner that a predetermined interval is left between an outermost winding of the plane coil and the outside frame, and the outermost winding of the plane coil is connected with a support portion extending from an inside edge of the outside frame.

23. The IC card of claim 22 wherein the outside frame comprises two rails extending in a longitudinal direction substantially parallel to each other and separated by a first distance, and two bars extending in a traverse direction and separated by a second distance such that the plane coil is in the space defined by the bars and rails and the distances therebetween, the plane coil comprises at least two substantially straight sides, and the two substantially straight sides are substantially parallel to two of the rails or bars.

24. The IC card of claim 16 wherein at least one winding has a length which extends a small fraction of the way around that winding that is displaced from the geometric pattern in an inward direction, and at least one winding has a length which extends a small fraction of the way around that winding that is displaced from the geometric pattern in an outward direction.

25. The IC card of claim 16 wherein at least one winding has a first displaced portion comprising a length which extends a small fraction of the way around that winding that is displaced from the geometric pattern in an inward direction, and a second displaced portion comprising at least one winding has a length which extends a small fraction of the way around that winding that is displaced from the geometric pattern in an outward direction, wherein the displaced portions do not include the same small fractions of the way around that winding.

* * * * *